(12) United States Patent
Herrmann

(10) Patent No.: US 9,831,227 B2
(45) Date of Patent: *Nov. 28, 2017

(54) OPTOELECTRONIC SEMICONDUCTOR APPARATUS AND CARRIER ASSEMBLY

(71) Applicant: OSRAM Opto Semiconductors GmbH, Regensburg (DE)

(72) Inventor: Siegfried Herrmann, Neukirchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/183,867

(22) Filed: Jun. 16, 2016

(65) Prior Publication Data

US 2016/0293587 A1    Oct. 6, 2016

Related U.S. Application Data

(62) Division of application No. 14/428,326, filed as application No. PCT/EP2013/068733 on Sep. 10, 2013, now Pat. No. 9,397,076.

(30) Foreign Application Priority Data

Sep. 14, 2012   (DE) .................. 10 2012 108 627

(51) Int. Cl.
*H01L 33/00*   (2010.01)
*H01L 25/16*   (2006.01)
(Continued)

(52) U.S. Cl.
CPC ........ *H01L 25/167* (2013.01); *H01L 23/5384* (2013.01); *H01L 23/5386* (2013.01); (Continued)

(58) Field of Classification Search
CPC ............ G01R 31/2635; H01L 2224/16; H01L 23/5384; H01L 23/5386; H01L 25/0753; (Continued)

(56) References Cited

U.S. PATENT DOCUMENTS 5,891,606 A * 4/1999 Brown .................. H05K 1/115
216/18
6,586,835 B1   7/2003 Ahn et al.
(Continued)

FOREIGN PATENT DOCUMENTS

DE      102009053064 A1   5/2011
EP          2442362 A1   4/2012
WO       2012063459 A1   5/2012

*Primary Examiner* — Mohammed Shamsuzzaman
(74) *Attorney, Agent, or Firm* — Slater Matsil, LLP

(57) ABSTRACT

A semiconductor apparatus with an optoelectronic device and a further device is disclosed. Embodiments of the invention provide a semiconductor apparatus with an optoelectronic device and a further device, wherein the optoelectronic device and the further device are interconnected to one another in parallel when the semiconductor apparatus is in operation, wherein the optoelectronic device is connected to a first contact and a second contact, the first contact and the second contact being configured to externally contact the semiconductor apparatus, and wherein the further device is connected with at least one further contact of the semiconductor apparatus.

8 Claims, 5 Drawing Sheets

(51) Int. Cl.

| | | |
|---|---|---|
| *H01L 25/075* | (2006.01) | |
| *H01L 33/62* | (2010.01) | |
| *H01L 23/538* | (2006.01) | |
| *H01L 27/02* | (2006.01) | |
| *H01L 31/02* | (2006.01) | |
| *H01S 5/022* | (2006.01) | |
| *G01R 31/26* | (2014.01) | |

(52) U.S. Cl.
CPC ........ *H01L 25/0753* (2013.01); *H01L 25/165* (2013.01); *H01L 27/0255* (2013.01); *H01L 31/02002* (2013.01); *H01L 33/62* (2013.01); *H01S 5/02248* (2013.01); *G01R 31/2635* (2013.01); *H01L 2224/16* (2013.01)

(58) Field of Classification Search
CPC . H01L 25/165; H01L 25/167; H01L 27/0255; H01L 31/02002; H01L 33/62; H01S 5/02248
USPC ......... 257/99, 91, 98, 79, 603, 666, 88, 678; 430/312
See application file for complete search history.

(56) References Cited

U.S. PATENT DOCUMENTS

| | | | |
|---|---|---|---|
| 6,593,597 | B2 | 7/2003 | Sheu |
| 9,397,076 | B2 * | 7/2016 | Herrmann ........... H01L 25/0753 |
| 2005/0205974 | A1 * | 9/2005 | Su ......................... H01L 33/486 257/678 |
| 2007/0170450 | A1 | 7/2007 | Murphy |
| 2007/0170933 | A1 | 7/2007 | Ma |
| 2010/0258827 | A1 * | 10/2010 | Lee ......................... H01L 24/26 257/98 |
| 2010/0283062 | A1 | 11/2010 | Hsieh et al. |
| 2011/0042699 | A1 * | 2/2011 | Park ...................... H01L 33/486 257/98 |
| 2011/0272728 | A1 * | 11/2011 | Rode .................... H01L 25/167 257/99 |
| 2011/0278627 | A1 * | 11/2011 | Kim ...................... H01L 25/167 257/98 |
| 2011/0284887 | A1 * | 11/2011 | Wu ......................... H01L 33/62 257/91 |
| 2012/0018763 | A1 * | 1/2012 | Engl ...................... H01L 27/15 257/99 |
| 2012/0091476 | A1 | 4/2012 | Su |
| 2012/0098025 | A1 * | 4/2012 | Hoppel ................. H01L 33/486 257/99 |
| 2012/0223416 | A1 * | 9/2012 | Scheubeck ........... H01L 25/167 257/603 |
| 2013/0140598 | A1 * | 6/2013 | Hoppel ................... H01L 33/40 257/98 |
| 2013/0241040 | A1 * | 9/2013 | Tojo ...................... H01L 23/051 257/666 |
| 2013/0292735 | A1 * | 11/2013 | Hoppel ............. H01L 23/49827 257/99 |

* cited by examiner

OPTOELECTRONIC SEMICONDUCTOR APPARATUS AND CARRIER ASSEMBLY

CROSS-REFERENCE TO RELATED APPLICATIONS

This patent application is a divisional of U.S. application Ser. No. 14/428,326, filed on Mar. 13, 2015 which is national phase filing under section 371 of PCT/EP2013/068733, filed Sep. 10, 2013, which claims the priority of German patent application 10 2012 108 627.3, filed Sep. 14, 2012, each of which is incorporated herein by reference in its entirety.

TECHNICAL FIELD

The present application relates to an optoelectronic semiconductor apparatus and a carrier assembly.

BACKGROUND

Optoelectronic semiconductor apparatuses often comprise two or more devices which are operated jointly. Such integration of a plurality of devices may, however, complicate testing of the devices during production.

SUMMARY

According to at least one embodiment of the optoelectronic semiconductor apparatus, the semiconductor apparatus comprises an optoelectronic device. The optoelectronic device may be provided for receiving and/or for generating electromagnetic radiation, in particular radiation in the infrared, visible or ultraviolet spectral range.

In particular, the optoelectronic device may comprise a semiconductor body with a semiconductor layer sequence, wherein the semiconductor layer sequence comprises an active region provided for receiving and/or for generating radiation.

According to at least one embodiment of the optoelectronic semiconductor apparatus, the semiconductor apparatus comprises a further device. The further device may be an electronic device or a further optoelectronic device. The electronic device may, for example, take the form of an ESD (electrostatic discharge) protective diode which is provided to protect the optoelectronic device from an electrostatic discharge.

The further optoelectronic device and the optoelectronic device may be of identical construction. For example, the optoelectronic device and the further optoelectronic device may in each case comprise a semiconductor body, wherein the semiconductor bodies emerge from the semiconductor layer sequence during production. The semiconductor layers of the optoelectronic device and the semiconductor layers of the further optoelectronic device are thus, disregarding manufacturing tolerances, identical.

Alternatively, the optoelectronic device and the further optoelectronic device may also differ from one another. For example, the optoelectronic device and the further optoelectronic device may be provided to emit radiation with different peak wavelengths or with different spectral distributions.

According to at least one embodiment of the optoelectronic semiconductor apparatus, the optoelectronic device and the further device are interconnected to one another in parallel. The phrase "interconnected to one another in parallel" includes both an interconnection in which the conducting directions of the optoelectronic device and the further device are oriented parallel to one another and an interconnection with antiparallel orientation of the conducting directions.

According to at least one embodiment of the optoelectronic semiconductor apparatus, the optoelectronic device is connected with a first contact and a second contact. The first contact and the second contact are provided for external electrical contacting of the semiconductor apparatus. For example, when the optoelectronic semiconductor apparatus is in operation, charge carriers can be injected from different sides via the first contact and the second contact into the active region of the optoelectronic device and there recombine to emit radiation.

According to at least one embodiment of the optoelectronic semiconductor apparatus, the further device is connected with at least one further contact of the semiconductor apparatus. The further contact is electrically separated from the first contact and from the second contact. There is thus no direct current path between the first contact and the further contact and between the second contact and the further contact.

By means of the further contact, the further device is electrically contactable, in particular independently of the optoelectronic device, at least during production of the optoelectronic semiconductor apparatus.

According to at least one embodiment of the optoelectronic semiconductor apparatus, the semiconductor apparatus comprises an optoelectronic device and a further device which are interconnected to one another in parallel when the apparatus is in operation. The optoelectronic device is connected with a first contact and a second contact for external contacting of the semiconductor apparatus and the further device is connected with at least one further contact of the semiconductor apparatus.

According to at least one embodiment of the optoelectronic semiconductor apparatus, during mounting on a connection carrier, the first contact and further contact are provided for fastening to a common electrical connection carrier land of the connection carrier. During mounting, the first contact and further contact are thus electrically conductively connected to one another via the common electrical connection carrier land. On fastening to the connection carrier, the first contact and further contact are thus electrically short-circuited. In contrast with the conventional procedure, in which separate contacts are also electrically contacted separately from one another, two contacts are thus intentionally electrically short-circuited in order to achieve electrical parallel interconnection of the devices. The number of electrical connection carrier lands for contacting the optoelectronic semiconductor apparatus is thus smaller than the number of contacts of the optoelectronic semiconductor apparatus. In particular, the optoelectronic semiconductor apparatus may have exactly three contacts and the connection carrier exactly two electrical connection carrier lands for the semiconductor apparatus.

Such a semiconductor arrangement thus comprises at least one optoelectronic semiconductor apparatus and a connection carrier, wherein the first contact and the further contact of the semiconductor apparatus are arranged on a common electrical connection carrier land of the connection carrier.

According to at least one embodiment of the optoelectronic semiconductor apparatus, the optoelectronic device, prior to mounting on a connection carrier, may be operated independently of the further device by means of the first contact and the second contact. The optoelectronic device may thus be contacted, for example, for testing purposes, without the further device simultaneously also being brought into operation.

According to at least one embodiment of the optoelectronic semiconductor apparatus, the further device is electrically conductively connected with the second contact. Parallel operation of the optoelectronic device and the further device may proceed by establishing an electrical connection between the first contact and the further contact.

According to at least one embodiment of the optoelectronic semiconductor apparatus, the semiconductor apparatus comprises a carrier with a major face on which the optoelectronic device is arranged. The carrier extends in a vertical direction between the major face and a back remote from the optoelectronic device. One or more lands for the optoelectronic device and/or for the further device may be provided on the major face of the carrier. One or more back contact surfaces may be arranged on the back of the carrier. Preferably, all the contacts necessary for operation of the semiconductor apparatus are accessible from the back.

The carrier preferably contains a semiconductor material, for example, silicon. Another semiconductor material, for instance germanium or gallium arsenide, may however also be used. Alternatively, the carrier may contain a ceramic such as for instance aluminum nitride, aluminum oxide or boron nitride.

According to at least one embodiment of the optoelectronic semiconductor apparatus, the carrier comprises a first land on the major face. The first land is electrically conductively connected with the optoelectronic device. The first land is electrically conductively connected by means of a through via through the carrier with a first back contact surface, arranged on the back of the carrier, of the first contact. The optoelectronic device is thus electrically contactable from the back of the carrier.

According to at least one embodiment of the optoelectronic semiconductor apparatus, the carrier comprises, on the major face, a first front contact surface. The first front contact surface is connected by means of a further through via with the first back contact surface. The first front contact surface is furthermore spaced from the first land. In addition to being electrically contactable via the first back contact surface, the optoelectronic device is thus also electrically contactable via the first front contact surface. In this way, testing the semiconductor apparatus from the front is simplified.

According to at least one embodiment of the optoelectronic semiconductor apparatus, the semiconductor apparatus is free of a direct front current path between the first land and the first front contact surface. A current path between the first land and the first contact surface passes twice through the carrier in a vertical direction extending perpendicularly to the major face. When testing the semiconductor apparatus by electrically contacting the first front contact surface, it is thus also possible for the through via to be tested and taken into account. The first land may furthermore be constructed such that it can be electrically contacted on the front for testing purposes. For example, in plan view onto the semiconductor apparatus, the first land may project beyond the optoelectronic device. At least one region of the first land is thus freely accessible on the front.

In plan view onto the semiconductor apparatus, the first front contact surface and the optoelectronic device may be arranged adjacent one another without overlap.

According to at least one embodiment of the optoelectronic semiconductor apparatus, the further device is integrated in the carrier. The further device may, for example, be an ESD protective diode integrated into the carrier. The ESD protective diode may, for example, be formed by means of at least one doped region of the carrier. The carrier may in particular comprise a p-conductive region and an n-conductive region.

According to at least one embodiment of the optoelectronic semiconductor apparatus, a distance between the first contact and the further contact is smaller than a distance between the first contact and the second contact. The distance between the first contact and the further contact may, for example, amount to between 1 μm and 100 μm inclusive.

In order to produce a plurality of semiconductor apparatuses the carrier preferably takes the form of a carrier assembly. Once the carrier assembly has been populated with optoelectronic devices and optionally electronic devices, semiconductor apparatuses, in which in each case part of the carrier assembly forms the carrier, can be obtained by singulating the carrier assembly.

The carrier assembly preferably comprises a plurality of device regions which are furthermore preferably arranged adjacent one another in a lateral direction, for example, as a matrix. At least one device region, preferably each device region, of the carrier assembly preferably comprises one or more of the features described in connection with the carrier.

According to at least one embodiment of the carrier assembly, the carrier assembly comprises a plurality of device regions which are arranged adjacent one another in a lateral direction. Each device region comprises a first land and a second land on a major face, which lands are in each case provided for electrically contacting an optoelectronic semiconductor device. On a back opposite the major face, each device region comprises a first back contact surface and a second back contact surface. The first back contact surface and the second back contact surface are in each case electrically conductively connected by means of a through via with the first land and the second land respectively. Each device region comprises on the major face a first front contact surface which is electrically conductively connected by means of a further through via with the first back contact surface.

The carrier assembly is particularly suitable for producing a semiconductor apparatus as described above. Features described in connection with the semiconductor apparatus may therefore also be used for the carrier assembly and vice versa.

BRIEF DESCRIPTION OF THE DRAWINGS

Further features, embodiments and convenient aspects are revealed by the following description of the exemplary embodiments in conjunction with the figures.

In the drawings.

Figure 1A:
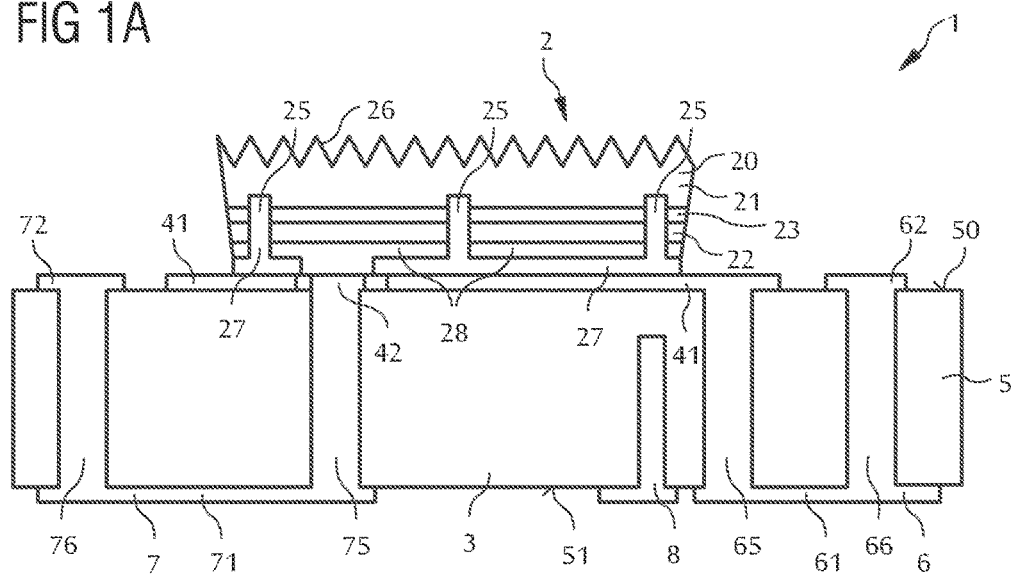
FIGS. 1A and 1B show an exemplary embodiment of a semiconductor apparatus and FIG. 1C shows an exemplary embodiment of a semiconductor arrangement with such a semiconductor apparatus in schematic sectional view.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

A first exemplary embodiment of a semiconductor apparatus is shown in schematic sectional view in FIG. 1A. The semiconductor apparatus 1 comprises an optoelectronic device 2. The optoelectronic device 2 comprises a semiconductor body 20 with a semiconductor layer sequence. The semiconductor layer sequence forms the semiconductor body. The semiconductor layer sequence comprises an active region 23 provided for generating radiation, which active region is arranged between a first semiconductor layer 21 and a second semiconductor layer 22. The first semiconductor layer, the second semiconductor layer and the active region are preferably in each case of multilayer construction. The optoelectronic device 2 may, for example, take the form of luminescent diode chip, for instance a light-emitting diode chip or a laser diode chip. Alternatively, the optoelectronic device 2 may also take the form of a radiation receiver in which radiation absorbed in the active region 23 is detected.

The semiconductor body 20, in particular the active region 23 preferably contains a III-V semiconductor material. III-V-semiconductor materials are particularly suitable for producing radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) as far as into the infrared ($Al_xIn_yGa_{1-x-y}As$) range of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V semiconductor materials, in particular from the stated material systems, it is additionally possible to achieve high internal quantum efficiencies in the generation of radiation.

The optoelectronic device 2 is arranged on a carrier 5. The carrier extends in vertical direction between a major face 50 facing the optoelectronic device 2 and a back 51 remote from the device.

The carrier 5 preferably contains a semiconductor material, for example, silicon. Another semiconductor material, for instance gallium arsenide or germanium, may however also be used. An electronic device can be particularly straightforwardly integrated into a carrier based on a semiconductor material. In particular, if the further device 3 is formed outside the carrier 5, a different material may be used for the carrier, for example, a ceramic, for instance aluminum nitride, aluminum oxide or boron nitride.

A first land 41 and a second land 42 are formed on the major face 50. The lands 41, 42 are formed and arranged such that charge carriers can be injected from different sides into the active region 23 via the lands. The first land 41 and the second land 42 are preferably arranged without overlap on the major face 50 of the carrier and electrically insulated from one another. In plan view onto the semiconductor apparatus 1, the optoelectronic device 2, the first land 41 and the second land 42 overlap at least in places.

In the exemplary embodiment shown, the semiconductor body 20 comprises a plurality of recesses 25 which in each case extend from the side of the semiconductor body facing the carrier 5 through the second semiconductor layer 22 and the active region 23. A first contacting layer 27 is formed in the recess 25. The first contacting layer 27 is electrically conductively connected with the first land 41, for example, via an electrically conductive connecting means, for instance a brazing solder or an electrically conductive adhesive layer (not explicitly shown in the figures).

A second contacting layer 28 is formed on the second semiconductor layer 22. The second contacting layer 28 serves for electrical contacting of the second semiconductor layer 22. The second contacting layer 28 furthermore preferably takes the form of a mirror layer for the radiation generated in the active region 23. The second contacting layer preferably contains silver, rhodium, palladium, iridium or aluminum or a metal alloy with at least one of the stated materials. The stated materials are distinguished by an elevated reflectivity in the visible and ultraviolet spectral range. The second contacting layer 28 is arranged in places between the first contacting layer 27 and the second semiconductor layer 22. In plan view onto the semiconductor apparatus, the first contacting layer and the second contacting layer thus overlap in places.

An electrical insulation layer, for example, an oxide layer such as a silicon oxide layer, is preferably formed between the first contacting layer 27 and the second contacting layer 28 such that there is no direct electrical contact between the first contacting layer and the second contacting layer. For simplicity of depiction, this insulation layer is not shown in the figures. Furthermore, an insulation layer may be provided in the region of the recesses 25 for electrically insulating the first contacting layer 27 from the active region 23 and from the second semiconductor layer 22 (not explicitly shown).

On the side remote from the carrier 5, the semiconductor body 20 has a patterning 26. The patterning is provided to increase the outcoupling efficiency of the radiation generated in the active region 23. Patterning may proceed, for example, mechanically, for instance by grinding or lapping, and/or chemically, for instance by wet chemical or dry chemical etching. The patterning may furthermore be regularly or irregularly formed.

The semiconductor apparatus 1 furthermore comprises a first contact 6 and a second contact 71. External electrical contacting of the semiconductor apparatus 1 proceeds via these contacts. The semiconductor apparatus takes the form of a surface-mounted device (SMD).

In the exemplary embodiment shown, the optoelectronic device 2 takes the form of a thin-film device in which a growth substrate for the semiconductor layer sequence has been removed. In contrast thereto, the optoelectronic device 2 may instead comprise the growth substrate. The first semiconductor layer 21 and the second semiconductor layer 22 may also be contacted in different ways.

The first contact 6 has a first back contact surface 61 and a first front contact surface 62. The first front contact surface 62 and the first land 41 are arranged adjacent one another without overlap on the major face 50 of the carrier 5. The first land 41 is electrically conductively connected by means of a through via 65 with the first back contact surface 61. Furthermore, the first front contact surface 62 is electrically conductively connected by means of a further through via 66 with the first back contact surface 61.

The first land 41 and the first front contact surface 62 are thus not connected to one another via a direct connection on the front, but instead only via a current path which extends in the vertical direction twice through the carrier 5.

Similarly, the second contact 7 has a second back contact surface 71, a second front contact surface 72, a through via 75 and a further through via 76. The second front contact surface 72 is thus electrically conductively connected with the second land 42 by means of the through via 75 and the further through via 76.

The semiconductor apparatus 1 furthermore comprises a further device 3. In the exemplary embodiment shown, the further device 3 takes the form of an electronic device which is integrated into the carrier 5. In particular, the electronic device 3 is provided as an ESD protective diode for protecting the optoelectronic device 2 from an electrostatic discharge. The protective diode may, for example, be formed by differently doped regions of the carrier 5. This is described in greater detail in connection with FIGS. 4A and 4B. In contrast thereto, the electronic device may, however, also be formed on the carrier 5.

Figure 1B:
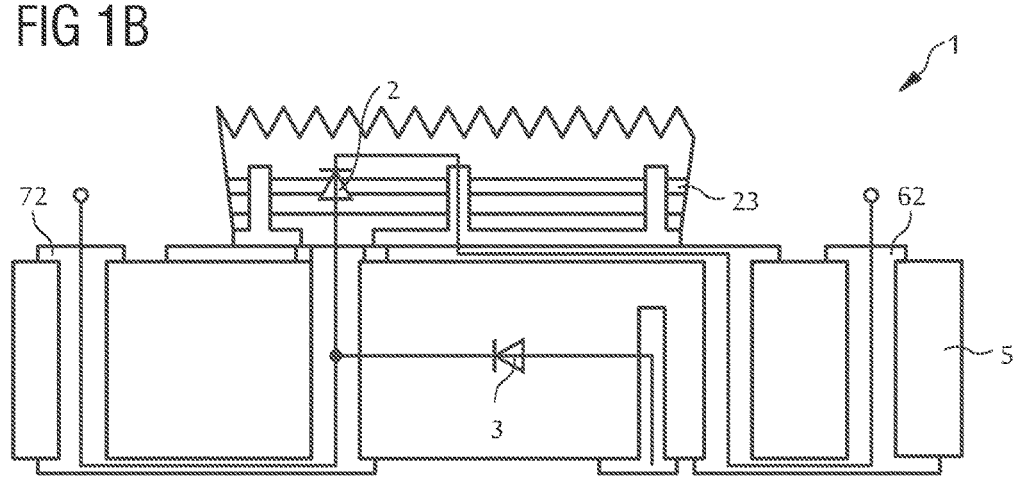

The electronic device 3 comprises a further contact 8. The further device 3 is externally electrically contactable via the further contact 8 and the second contact 7. FIG. 1B shows an electrical interconnection of the semiconductor apparatus 1 for testing purposes. By applying an electrical voltage between the first front contact surface 62 of the first contact 6 and the second front contact surface 72 of the second contact 7, charge carriers can be injected from different sides into the active region 23 of the optoelectronic device 2 and there recombine to emit radiation.

The further device 3, on the other hand, is electrically insulated from at least one of the contacts, in the exemplary embodiment shown from the first contact 6, such that the optoelectronic device 2 may be tested independently of the ESD protective diode. In particular, the optoelectronic device 2 may also be tested in non-conducting direction. If, on the other hand, the further device 3 were electrically conductively connected with the first contact 6 and the second contact 7, the optoelectronic device 2 could not be characterized in the non-conducting direction since the charge carriers would drain via the further device 3 due to the antiparallel orientation of the conducting directions.

Furthermore, the optoelectronic device 2 is characterized by way of a current path which passes via the through vias 65, 66 of the first contact 6 and via the through vias 75, 76 of the second contact 7 of the carrier 5. In this manner, the influence of the through vias, for example, with regard to the series resistance of the semiconductor apparatus 1, may also be investigated.

In addition, the optoelectronic device 2 may also be characterized by contacting the first land 41 instead of first front contact surface 62. In this case, the through via 65 and the further through via 66 are thus bypassed. The series resistance caused by the through vias may be particularly reliably determined in this manner.

Figure 1C:
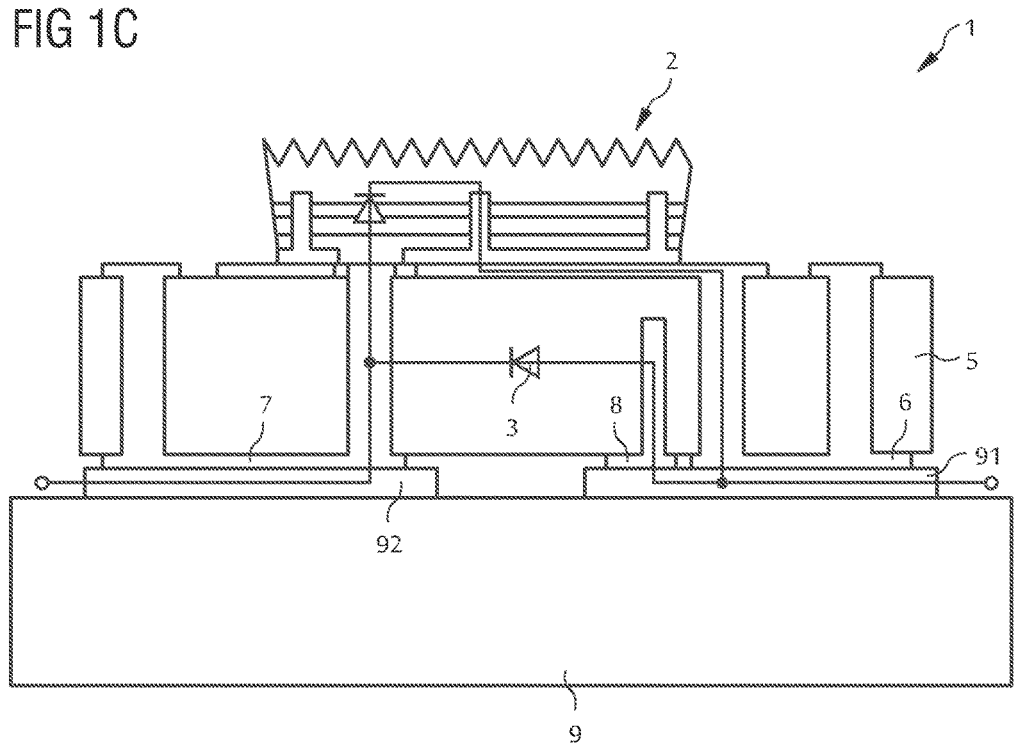

FIG. 1C, which also represents such a semiconductor arrangement, shows the interconnection of the semiconductor apparatus 1 after mounting on a connection carrier 9. The connection carrier 9 has a first connection carrier land 91 and a second connection carrier land 92. The first connection carrier land 91 is electrically conductively connected with the first contact 6 and the further contact 8. The second connection carrier land 92 is electrically conductively connected with the second contact 7. The first contact 6 and the further contact 8 are thus arranged on a common connection carrier land. Mounting the semiconductor apparatus 1 results in a parallel interconnection of the optoelectronic device 2 with the further device 3. With regard to conducting direction, the optoelectronic device 2 and the further device 3 are oriented antiparallel to one another, such that, in the event of electrostatic charging in the non-conducting direction of the optoelectronic device 2, charge carriers may drain away via the further device 3.

An additional production step for parallel interconnection of the optoelectronic device 2 and further device 3 may thus be dispensed with. The distance between the further contact 8 and the first contact 6 is accordingly preferably smaller than the distance between the further contact 8 and the second contact 7 and smaller than the distance between the first contact 6 and the second contact 7. Thanks to a small distance between the first contact and the further contact, these contacts may be more simply electrically conductively connected to one another via a common connection carrier, without the size of the connection carrier land 91 having to be increased for this purpose.

Using the described contact guidance, it is possible simply and reliably to provide a parallel interconnection of two devices in a semiconductor apparatus, while nevertheless permitting at least one of the devices or both of the devices to be tested separately from one another during production. In particular, an ESD protective diode can be integrated into the carrier 5 of an optoelectronic device 2 without the device integrated into the carrier complicating characterization for testing purposes.

It goes without saying that the semiconductor apparatus 1 may also comprise more than one further device 3. To ensure separate contactability in each case, a further contact 8 may be associated with each further device. Alternatively it is also conceivable for a further contact to be associated in each case with a group having two or more further devices.

Figure 2A:
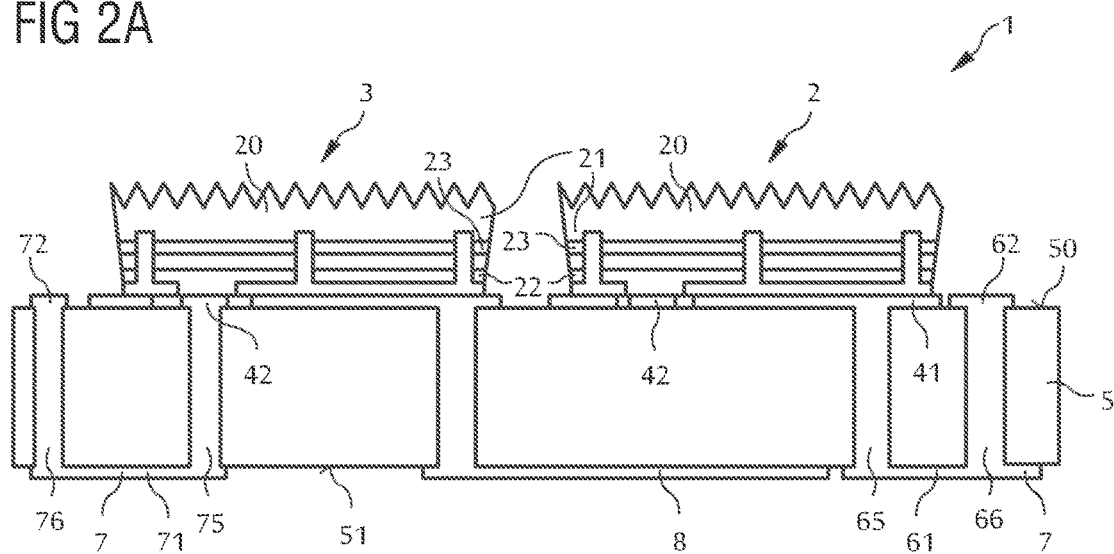
FIG. 2A shows a second exemplary embodiment of a semiconductor apparatus in schematic sectional view with associated equivalent circuit diagrams before (FIG. 2B) and after (FIG. 2C) electrical contacting of the semiconductor apparatus.

The second exemplary embodiment of a semiconductor apparatus shown in FIG. 2A substantially corresponds to the first exemplary embodiment described in connection with FIGS. 1A to 1C. At variance therewith, the further device 3 is an optoelectronic device.

The further device 3 is not integrated into the carrier 5, but instead arranged on the major face 50 of the carrier 5.

In particular, the optoelectronic device 2 and the further device 3 may be of identical construction. For example, the optoelectronic device 2 and the further device 3 may emit radiation in the same wavelength range. During production, the semiconductor bodies 20 of the devices may emerge from the same semiconductor layer sequence. Alternatively, the optoelectronic device 2 and the further device 3 may also differ from one another. For example, the devices may emit radiation in wavelength ranges which differ from one another or with spectral distributions which differ from one another and/or intensities which differ from one another.

Figure 2B:
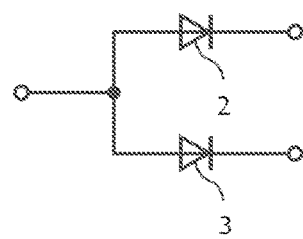

Prior to mounting of the semiconductor apparatus 1, the optoelectronic device 2 and the further optoelectronic device 2, as shown schematically in FIG. 2B, are still electrically contactable separately from one another.

Figure 2C:
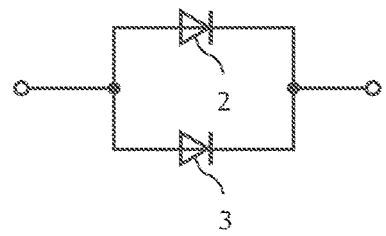

After mounting on a connection carrier 9, the devices 2, 3 are interconnected to one another in parallel as shown in FIG. 2C. In one embodiment of the further device 3 as an optoelectronic device, the optoelectronic device 2 and the further device 3 are preferably interconnected in parallel with regard to their conducting direction, such that both devices emit radiation simultaneously. In this manner, the total radiant power emitted by the semiconductor apparatus 1 may be increased.

Figure 3A:
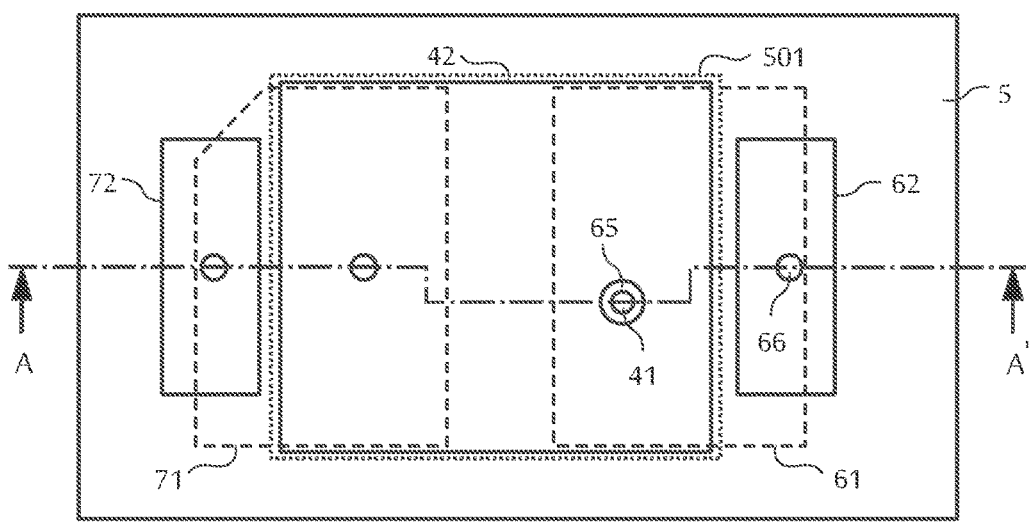
FIGS. 3A and 3B show a portion of a carrier assembly in schematic plan view (FIG. 3A) and associated sectional view in FIG. 3B.
Figure 3B:
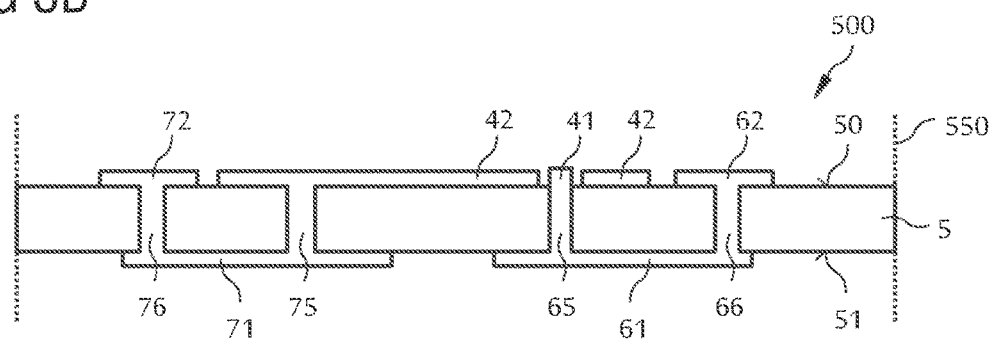

One exemplary embodiment of a carrier assembly is shown in FIG. 3A in schematic plan view and in an associated sectional view in FIG. 3B. For simplicity of depiction, the figures in each case show a portion of the carrier assembly which corresponds to exactly one device region 500. In particular after population with optoelectronic devices 2 and optionally further devices, the carrier assembly may be singulated along dividing lines 550, such that each semiconductor apparatus comprises a carrier 5. Such a carrier may in particular be used in a semiconductor apparatus of the kind described in connection with FIGS. 1A to 1C and 2A to 2C.

As described in connection with FIGS. 1A to 1C, the carrier 5 comprises a first land 41 and a second land 42 on a major face 50. On mounting an optoelectronic device in a mounting region 501, the optoelectronic device in each case at least in places overlaps the first land and the second land.

The first land 41 is electrically conductively connected by means of a through via 65, a first back contact surface 61 and a further through via 66 with a first front contact surface 62.

Similarly, the second land 42 is electrically conductively connected by means of a through via 75, a second back contact surface 71 and a further through via 76 with a second front contact surface 72. After mounting the optoelectronic device 2 in the mounting region 501, the optoelectronic device 2 can be electrically contacted from the front, where the devices are also arranged. The semiconductor apparatuses singulated from the carrier assembly may, on the other hand, be electrically contacted on the back with a reduced space requirement.

Figure 4A:
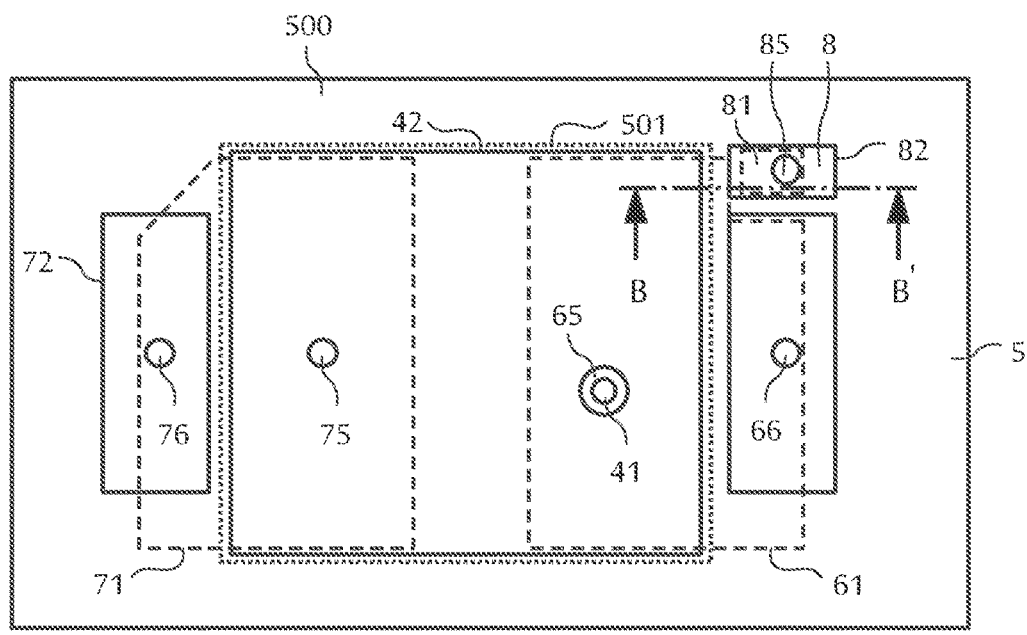
FIGS. 4A and 4B show a portion of a carrier assembly in schematic plan view (FIG. 4A) and associated sectional view in FIG. 4B.
Figure 4B:
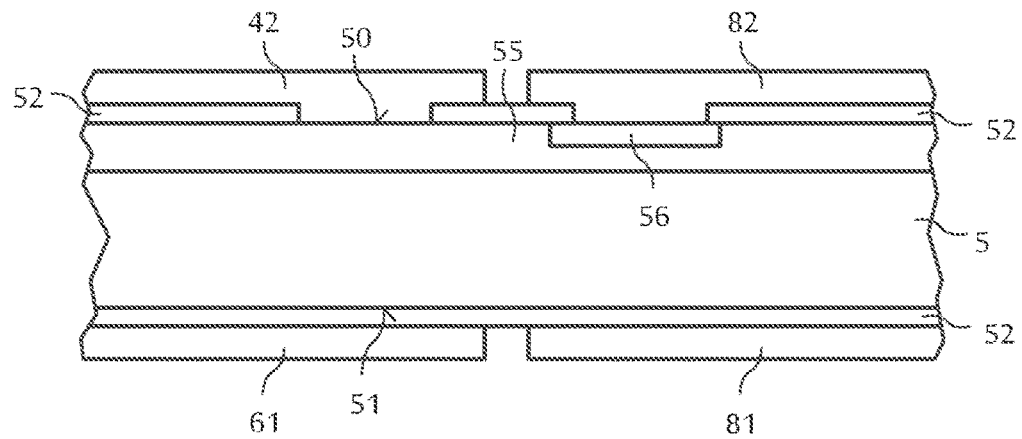

The second exemplary embodiment of a carrier assembly shown in FIG. 4A substantially corresponds to the first exemplary embodiment described in connection with FIGS. 3A and 3B. At variance therewith, the device region 500 comprises a further contact 8. The further contact 8 comprises a further back contact surface 81, a further front contact surface 82 and a through via 85. In plan view onto the carrier assembly, the first back contact surface 61 and the further back contact surface 81 are arranged adjacent one another without overlap.

The carrier 5 furthermore comprises a first region 55 and a second region 56, wherein the first region and the second region are differently doped from one another with regard to conduction type. For example, the first region may be p-conductive and the second region n-conductive or vice versa. A further device 3 in the form of a protective diode integrated into the carrier is formed by means of the regions 55 and 56. In the exemplary embodiment shown, the further device 3 is formed in the region of the major face 50 of the carrier 5. An insulation layer 52 is arranged on the major face 50 of the carrier 5. The insulation layer is arranged in between the carrier and the second land 42 and between the carrier and the further front contact surface. The insulation layer is opened up in places, such that the second land is electrically conductively connected in an opening with the first region 55 and the further front contact surface 82 is electrically conductively connected in a further opening with the second region 56.

In the exemplary embodiment shown, the first region 55 is electrically conductively connected with the second land 42 and the second region 56 is electrically conductively connected with the further front contact surface 82 of the further contact 8. The position and configuration of the further device 3 may, however, also deviate therefrom. For example, the first region 55 and the second region 56 may also be arranged on the back of the carrier 5, wherein one of the regions is electrically conductively connected with the second contact 7, for example, the second back contact surface 71, and the other region is electrically conductively connected with the further contact 8, for example, the further back contact surface 81. For the purpose of separately testing the mounted optoelectronic device independently of the further device 3, conveniently only either the first region 55 or the second region 56 is electrically conductively connected with the first contact 6 or the second contact 7.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

What is claimed is:

1. A carrier assembly comprising:
    a plurality of device regions arranged adjacent to one another in a lateral direction,
    a plurality of devices, each device of the plurality of devices disposed in a respective device region of the plurality of the device regions;
    wherein each device region comprises a first land and a second land on a major face, each land providing electrical connection for an optoelectronic semiconductor device,
    wherein each device region comprises, on a back opposite to the major face, a first back contact surface and a second back contact surface, wherein the first back contact surface and the second back contact surface are each electrically conductively connected by a through via with the first land and the second land respectively,
    wherein each device region comprises on the major face a first front contact surface electrically conductively connected by a further through via with the first back contact surface, and
    wherein each device of the plurality of devices is electrically connected to a respective further contact of the carrier assembly such that the respective device is externally electrically contactable via the respective further contact.

2. The carrier assembly according to claim 1, wherein a current path extending through the carrier assembly between a further front contact surface and the second land of the device regions in each case forms an ESD protective diode.

3. The carrier assembly according to claim 1, wherein the carrier assembly is free of a direct front current path between the first land and the first front contact surface, and wherein a current path between the first land and the first front contact surface passes twice through the carrier assembly in a vertical direction extending perpendicularly to the major face.

4. The carrier assembly according to claim 1, wherein the carrier assembly comprises a semiconductor material.

5. The carrier assembly according to claim 1, wherein each device region of the plurality of device regions comprises a respective device of the plurality of devices, integrated into the carrier assembly.

6. The carrier assembly according to claim 1, wherein each device region of the plurality of device regions comprises the respective further contact, each respective further contact comprising a further back contact surface.

7. The carrier assembly according to claim 6, wherein the first back contact surface and the further back contact surface are adjacent to one another without overlap.

8. The carrier assembly according to claim 1, wherein the carrier assembly comprises a first region and a second region, the first region and the second region being differently doped from one another with regard to conduction type, wherein the carrier assembly further comprises an insulation layer arranged on the major face of the carrier assembly, and wherein the insulation layer comprises openings in places such that the second land is electrically conductively connected in an opening with the first region and a further front contact surface is electrically conductively connected in a further opening with the second region.

\* \* \* \* \*